United States Patent
Shachal et al.

(10) Patent No.: US 6,627,886 B1
(45) Date of Patent: Sep. 30, 2003

(54) SECONDARY ELECTRON SPECTROSCOPY METHOD AND SYSTEM

(75) Inventors: Dov Shachal, Rehovot (IL); Noam Dotan, Givaataim (IL)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/312,271

(22) Filed: May 14, 1999

(51) Int. Cl.[7] .............................................. H01J 37/244
(52) U.S. Cl. ...................... 250/310; 250/305; 250/397
(58) Field of Search ................................ 250/310, 305, 250/306, 307, 397

(56) References Cited

U.S. PATENT DOCUMENTS

| | | | |
|---|---|---|---|
| 4,714,833 A | 12/1987 | Rose et al. ................. | 250/397 |
| 4,831,266 A | 5/1989 | Frosien et al. .............. | 250/347 |
| 4,896,036 A | 1/1990 | Rose et al. ................. | 250/310 |
| 4,941,980 A | 7/1990 | Halavee et al. ............. | 250/310 |
| 5,212,383 A * | 5/1993 | Scharf ........................ | 250/310 |
| 5,311,288 A | 5/1994 | Shahar ........................ | 356/375 |
| 5,466,940 A | 11/1995 | Litman et al. .............. | 250/397 |
| 5,644,132 A | 7/1997 | Litman et al. .............. | 250/310 |
| 6,066,849 A * | 5/2000 | Masnaghetti et al. ....... | 250/310 |
| 6,201,240 B1 * | 3/2001 | Dotan et al. ................. | 250/310 |

OTHER PUBLICATIONS

Reimer, L., "Image Formation in Low–Voltage Scanning Electron microscopy," *SPIE*, vol. TT12, Has no date.
Joy, David, et al., "Secondary electron spectroscopy for microanalysis and defect review," SPIE, vol. 3677, Mar. 1999, pp. 621–628.

* cited by examiner

*Primary Examiner*—Kiet T. Nguyen
(74) *Attorney, Agent, or Firm*—Sughrue Mion LLP

(57) ABSTRACT

A system and a method for fast characterization of sample's material composition, which is especially beneficial for semiconductor fabrication. The material composition is characterized by analyzing secondary electrons emission from the sample. According to one feature, electron detector is used to collect secondary electrons emanating from the sample. The detector is controlled to collect a specific narrow band of secondary electrons, and the band is controlled to allow for collection of SE at different energies. Two modes are disclosed: spot mode and secondary electron spectroscopy material imaging (SESMI). In the spot mode, a spectrum of SE is obtained from a single spot on the sample, and its characteristics are investigated to obtain information of the material composition of the spot. In the SESMI mode, an SEM image of an area on the sample is obtained. The SE spectrum at each pixel is investigated and correlated to a particular spectrum group. The image is then coded according to the SE spectrum grouping. The coding is preferably a color coding.

11 Claims, 3 Drawing Sheets

SECONDARY ELECTRON SPECTROSCOPY METHOD AND SYSTEM

FIELD OF THE INVENTION

The present invention relates to scanning electron microscopes (SEM) and, more particularly, to a method and apparatus for performing SE spectroscopy to determine the material composition of an observed sample.

BACKGROUND OF THE INVENTION

Scanning electron microscopes (SEM) are very useful for imaging very small elements on a sub-micron scale, with a resolution on the order of nanometers. Therefore, various SEM systems are used in the semiconductor industry for engineering and metrology. Recently, much attention has also been given to the use of SEM in investigation of defects on semiconductor circuits. Since the size of defects of interest (i.e., killer defects) continues to shrink with the shrinking of the design rules, there's a continuous need for improvement in the images obtained by such SEM.

As is well known to those skilled in the art, SEM images are obtained by directing a primary electron beam (PE) onto the sample, and using detectors to collect electrons returned from the sample. Some of these electrons are elastically reflected, while other like secondary electrons (SE) and back scattered electrons (BSE) are emitted from the sample as a result of inelastic collisions. The ratio of the number of emitted electrons to the primary electrons is referred to in the art as the "electron yield." This quantity is characteristic to the material making the sample.

For better understanding of the discussion that follows, the reader's attention is directed to FIG. 1, depicting the energy spectrum of electrons emitted from a sample upon the impingement of a primary electron beam (the plot is adopted from Image Formation in Low-Voltage Scanning Electron Microscopy, L. Reimer, SPIE, Vaaol. TT12). It is conventionally accepted that emitted electrons having energy up to 50 eV are SE, while emitted electrons having energy above 50 eV are BSE. Notably, the energy distribution of the SE is hardly influenced by the primary beam.

As is known in the art, and as can be understood from the above noted works, SEM images are generally created from SE or BSE depending on the purpose of the study. That is, when the study requires the ability to distinguish between different materials in the sample, BSE detectors are used since their emission is highly dependent on the sample's material composition. On the other hand, when it is important to understand the topography of the sample, SE detectors are used since their emission is highly dependent on the sample's topography.

An issue of interest for the semiconductor industry is obtaining a clear contrast of materials. Specifically, theoretical and experimental works showed the capabilities of using BSE for distinguishing between heavy elements, but BSE lacked this capability for the light elements. Therefore, the prevalent methods of obtaining material composition information is by x-ray or auger spectroscopy. However, both methods are too slow for in-line fabrication monitoring. Additionally, x-ray generally requires high PE potential, which may destroy or degrade the sample.

Thus, a better method is needed for distinguishing between elements, especially when similar, light, elements are present within the investigated sample. Such distinction is especially beneficial for identifying the composition of particles and other defect on semiconductor wafers, so that the origin of the defect may be identified.

Various works have tried to correlate the spectrum of secondary electrons to the material composition of the sample. It has been observed that, generally, SE spectrums obtained from insulators have a narrower peak that is situated at lower energies, as compared to SE spectrum of metals. This is depicted in FIG. 2, wherein N(E), the peak intensity, reflects the SE yield. However, to date no system is available to assist the semiconductor fabrication industry in analyzing and monitoring material composition on semiconductor wafers, especially of particles and other defects.

Much of the work that has been done aims at obtaining a complete spectroscopy to completely identify the element comprising the investigated sample. Such work is suitable for engineering analysis and other "in-depth" studies, where accuracy and completeness outweigh analysis speed. However, under certain conditions, such as during in-line monitoring of production line, analysis speed if of high importance and may force compromise in accuracy and completeness. Thus, there is a need for a new approach that provides fast analysis results for particular applications.

SUMMARY OF THE INVENTION

The present invention provides a solution to the above noted issues by taking a new approach to material characterization. Specifically, the approach of the present invention is especially beneficial when high analysis speed is required, while accuracy and completeness may be targeted to particular level, as acceptable for the particular application.

The present invention provides a system and a method for fast characterization of sample's material composition, which is especially beneficial for semiconductor fabrication. The present invention characterizes material composition by analyzing secondary electrons emission from the sample. Therefore, the invention is advantageous in that it does not require high PE voltage.

According to one feature of the present invention, electron detector is used to collect secondary electrons emanating from the sample. The detector is controlled to collect a specific narrow band of secondary electrons, and the band is controlled to allow for collection of SE at different energies.

Two modes are disclosed: spot mode and secondary electron spectroscopy material imaging (SESMI). In the spot mode, a spectrum of SE is obtained from a single spot on the sample, and its characteristics are investigated to obtain information of the material composition of the spot. In the SESMI mode, an SEM image of an area on the sample is obtained. The SE spectrum at each pixel is investigated and correlated to a particular spectrum group. The image is then coded according to the SE spectrum grouping. The coding is preferably a color coding.

Various systems for obtaining the SE spectroscopy are provided. Specifically, according to various embodiments contemplated, a retarding potential can be applied to the sample (e.g., the wafer), to the electron column end piece (such as the cap or the lens' pole pieces), or the detector. Alternatively, a deflection potential can be applied, for example by using a Wein filter. Another possibility is to use a commercial spectrometer, for example a cylindrical mirror analyzer, to record the spectrum of the emitted secondary electrons from the sample.

DETAILED DESCRIPTION OF SPECIFIC EMBODIMENTS

The present invention provides a method and a system for fast characterization of material composition, which is rather harmless to semiconductor samples. Moreover, the inventive system and method can be easily implemented in existing scanning electron microscopes (SEM). Furthermore, the method and system of the invention can provide an adequate analysis without increasing the energy of PE that is normally used to obtain an image of the sample.

While the method and system of the present invention can be implemented as a "stand alone" equipment, it is preferably implemented in an existing SEM equipment, such as the SEMVision™ and VeraSEM™ available from Applied Materials of Santa Clara, Calif. For brevity, the SEM system will not be discussed here, and the reader is instead referenced to U.S. Pat. Nos. 4,896,036; 4,831,266; 4,714,833; 4,941,980; 5,311,288; 5,466,940; and 5,644,132; which describe various aspects of SEM, and which are incorporated herein by reference.

As noted above, the invention uses information carried by secondary electrons to characterize the material composition of the inspected sample. Therefore, the first step of the invention is to acquire a spectrum of the emitted secondary electrons. The spectrum may be obtained by any means; however, a few embodiments will now be described with reference to FIG. 3.

Figure 1:
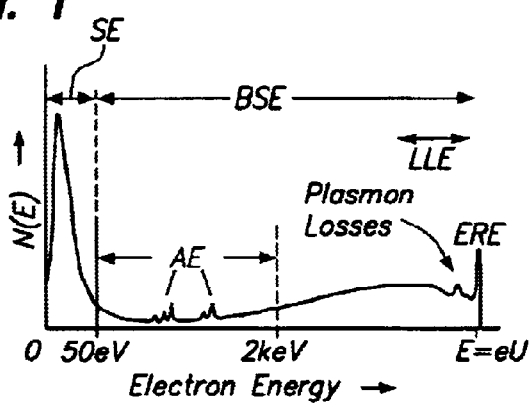
FIG. 1 is a plot of the energy spectrum of electrons emanating from a sample.
Figure 2A:
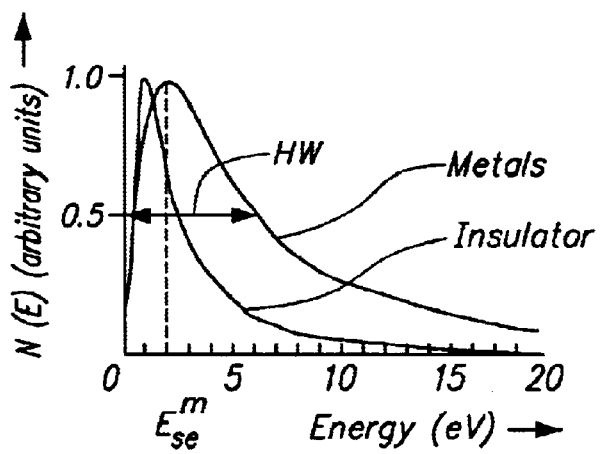
FIG. 2 is a plot of emission of SE from insulating and metal samples.
Figure 2B:
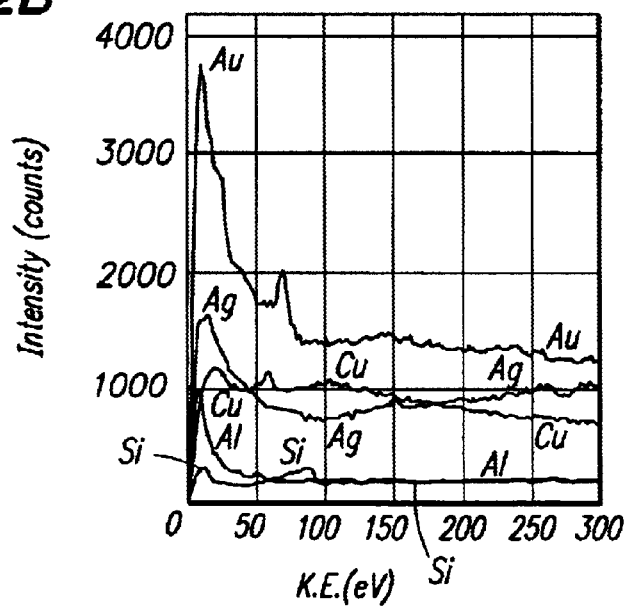
Figure 3:
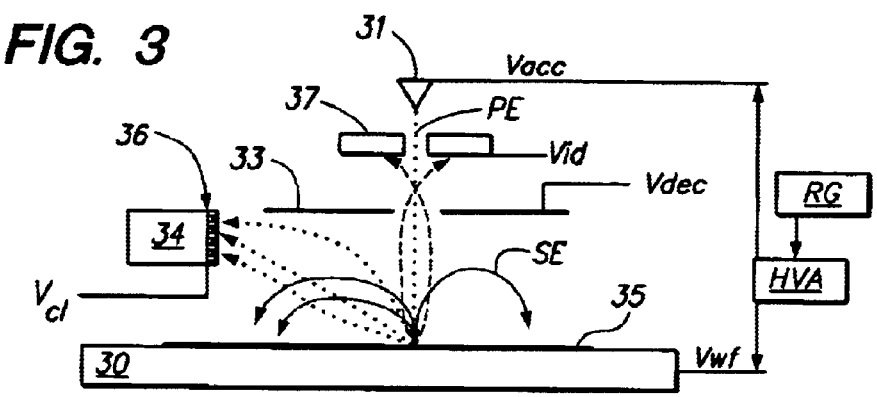
FIG. 3 is a schematic illustrating various elements relevant to various embodiment of the invention.

FIG. 3 illustrates various elements of a SEM system, such as the SEMVision™, while omitting various elements that are of no relevance to understanding of the invention. Notably, the elements shown in FIG. 3 are all known in the art and are described in the above cited patents. Wafer 35 is secured onto chuck 30, and is in physical and electrical contact thereto, so that the wafer is at potential Vwf. Electrons emitted from electron source 31 are formed into primary beam PE and accelerated to Vacc. Vacc is generally in the order of several kilovolts, which enables better focusing and manipulation by the electron optics and deflectors in the column (not shown). Prior to hitting the wafer, the primary electrons are decelerated by Vdec to energy on the order of several hundreds of volts, generally up to one kilovolt. The deceleration can be done by any means known in the art, such as applying a deceleration voltage to a pole piece of the objective lens (not shown), or to an electrode, both of which are exemplified by element 33.

Generally SE and BSE are emitted from the wafer; however, the invention is concerned primarily with SE, i.e., electrons having energy of up to 50 eV. An electron detector 34 is shown to have collection voltage Vcl applied to a collection face or grid 36. Notably, in various embodiments this voltage may be omitted. Such a detector can be, for example, an Everhart-Thornley, a solid state, or a Multi-Channel Plate (MCP), or any other suitable electron detector, and is generally referred to as an external detector. An internal detector is depicted at 37, and may generally have an toroidal or any other suitable shape. A voltage Vid is shown applied to the collecting face or grid of the internal detector, while it is understood that in certain embodiments this voltage can be eliminated. The system for implementing the present invention may have an external detector, an internal detector, or both. For example, the SEMVision™ noted above has one internal and two external detectors.

The system so far described is used to obtain images of specific locations on the wafer by setting the various applied voltages to the appropriate level, as is well known in the art. However, for obtaining the SE spectrum according to the invention, at least one of the applied voltages must be variable. Few examples of how to generate the SE spectrum using variable voltage will now be provided. According to a first embodiment, Vacc and Vdec remain constant, while Vcl and/or Vid (depending on which detector is used) is variable with time. According to this embodiment, Vwf may be eliminated or grounded.

As an example, the collection of SE with variable Vcl will now be described. Preliminary, it should be noted that, as is known in the art, decelerating voltage Vdec generates a field that generally attracts low energy SE (dashed arrows) into the column, thereby permitting their detection by the internal detector 37. However, faster, more energetic SE (dotted arrows) may escape this field and be detected by the external detector 34. The principle behind this example is that the energy of electrons collected by detector 34 can be controlled by varying Vcl. That is, the higher the attracting voltage set on Vcl, the more slower electrons will be veered away from the field of Vdec and collected by the external detector. In contrast, repelling potential can be set on Vcl so as to repel low energy SE and collect only high energy SE.

Figure 4:
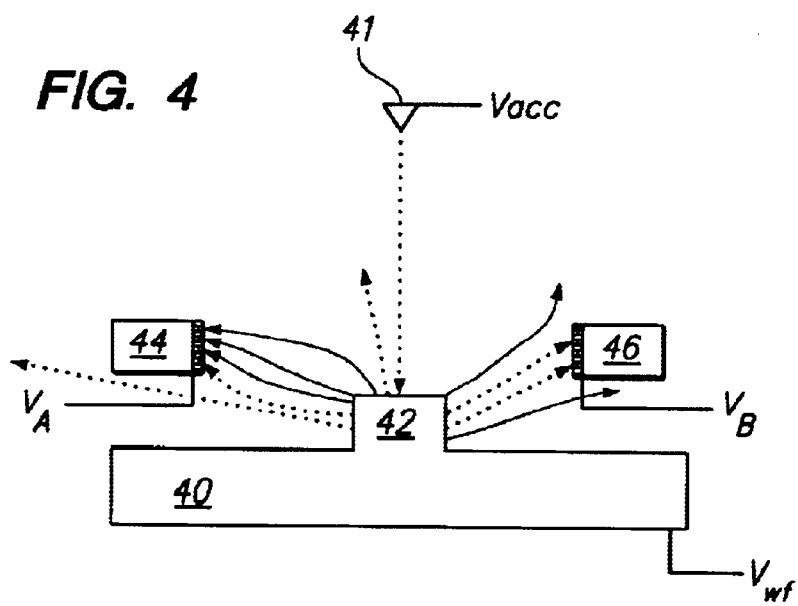
FIG. 4 is a schematic diagram depicting the influences of attractive and repelling fields on slow and fast SE.

For example, when Vcl is set to +100 volts, it will collect much of the very low energy SE; however, when it is set to −30 volts, it will repel all SE having energy below 30 eV and collect only energetic SE having energy between 30 eV and 50 eV. This is exemplified in FIG. 4, wherein detector 44 is provided with an attracting voltage $V_A$, thereby attracting slow SE. On the other hand, detector 46 is provided with a repelling potential $V_B$, thereby repelling relatively slow SE. Thus, by stepping the voltage Vcl up or down and sampling the image at each setting, a spectrum of the SE can be compiled. Of course, the same process can be performed with respect to Vid and, in fact, can be done in parallel with both internal and external detectors.

Another embodiment will now be described in which Vwf is varied (FIG. 3). In this case, Vdec, Vcl and Vid remain constant. Specifically, if one applied an attracting potential to Vwf, slow electrons will be attracted and return to the wafer, as depicted by the solid arrows. This will prevent their detection by either the external or the internal detectors. In contrast, by applying a repelling voltage to Vwf, emission of SE is enhanced and more slow SE will be detected by either detector. Thus, by stepping Vwf, one can control the energy of detected SE, thereby constructing an SE spectrum. This is done using a ramp generator RG and a high voltage amplifier HVA, as shown in FIG. 3.

However, varying Vwf will cause a defocusing problem. Specifically, for imaging purposes, Vacc is always adjusted so that the imaging point on the wafer is in focus of the PE beam. However, applying a potential to the wafer in electron optics would be similar to moving the object in light optics. Thus, the point of interest on the wafer would go out of focus. To avoid this problem, according to this embodiment an equal and potential of Vwf is added to Vacc. Thus, the accelerating voltage becomes Vacc+Vwf. Accordingly, the signal of the HVG is applied to both the wafer and Vacc, as shown in FIG. 3.

Figure 5:
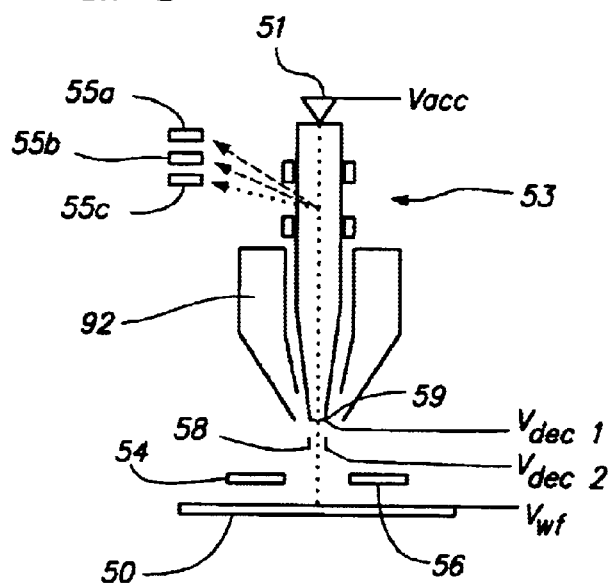
FIG. 5 is a schematic depicting another embodiment of the invention.

Another embodiment to obtain the SE spectrum is depicted in FIG. 5. In FIG. 5, Vacc, Vwf, Vdc1 and Vdec2 (two decelerating voltages are shown here only as a further example of decelerating system) are kept constant. However, a deflector 53, such as a Wein filter, is provided in the electron column. In this particular embodiment the deflector is depicted above the objective lens 52 as an exemplary, non-limiting, position only. As is well known in the art, the amount of deflection electrons exhibit due to a deflection field is dependent on their energy. Specifically, the slower the electron, the more it will be deflected. This is depicted by the dotted arrow representing the slowest SE, and the large-dashed arrow as the fastest SE. By using multiple detectors, or one position sensitive detector, both exemplified by elements 55a, 55b and 55c, a spectrum of the SE can be obtained.

Two modes for characterizing the material composition from the SE spectrum will now be described. The first mode is termed by the inventor as the "spot mode" and the second "secondary electron spectroscopy material imaging."

Spot Mode:

In a spot mode, an area of interest on the wafer is specified, generally from the generated SEM image. Then, an SE spectrum is obtained from the spot by either of the methods described above. A plot of the number of collected electrons (Ne) versus the energy (Ee) is obtained from the spectrum. For example, if using a variable Vwf, the derivative of the video signal from the detectors can be plotted against Vwf. That is, for any particular Vwf, the intensity of the video signal corresponds to the number of detected electrons having energy larger than Vwf. In order to obtain the spectrum, i.e., the number of electrons at a specific energy, the derivative of Ne v. Vwf has to be calculated. This step need not result in actual plot, but the relevant data can be arranged in a database to correspond to such a plot.

From the plot or data, various descriptors are obtained. Such descriptors may be, for example, peak location, peak width, integral under the curve (area), shape of the curve (e.g., flat, sharp, curvature, etc.) and so on. Then, the descriptors are compared against a database to characterize the material composition.

Figure 6:
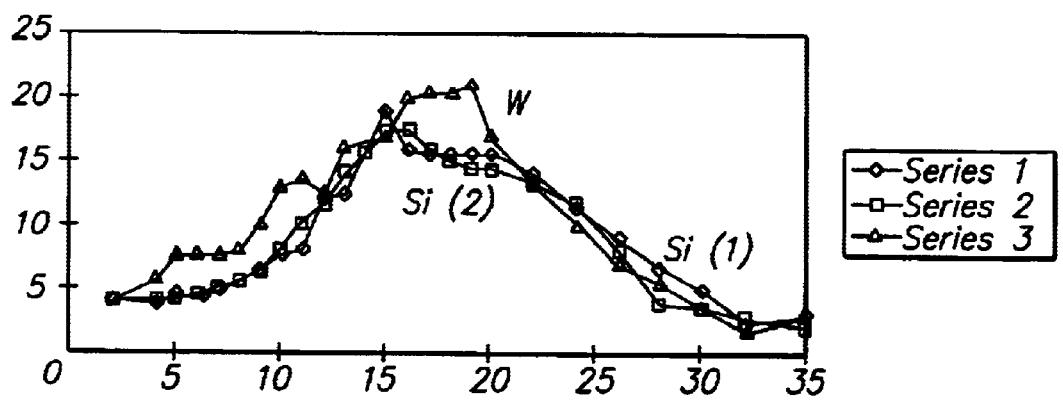
FIG. 6 is a plot of the number of collected electrons (Ne) versus the energy (Ee) obtained from a sample SE spectrum.

One reason such a system is particularly advantageous is that the number of materials used in the semiconductor processing is finite. Moreover, a specific database of descriptors can be easily built for each process run. For example, if the system is to be used to monitor a particular deposition process, the system can be used in a teaching mode. That is, various substrates of the materials that are expected to be present on the processed wafer, such as Si, SiO2, SiN2, Al, W, Ti, etc., are first scanned and the SE spectrum for each is obtained. Such a plot of substrates is depicted in FIG. 6.

Figure 7:
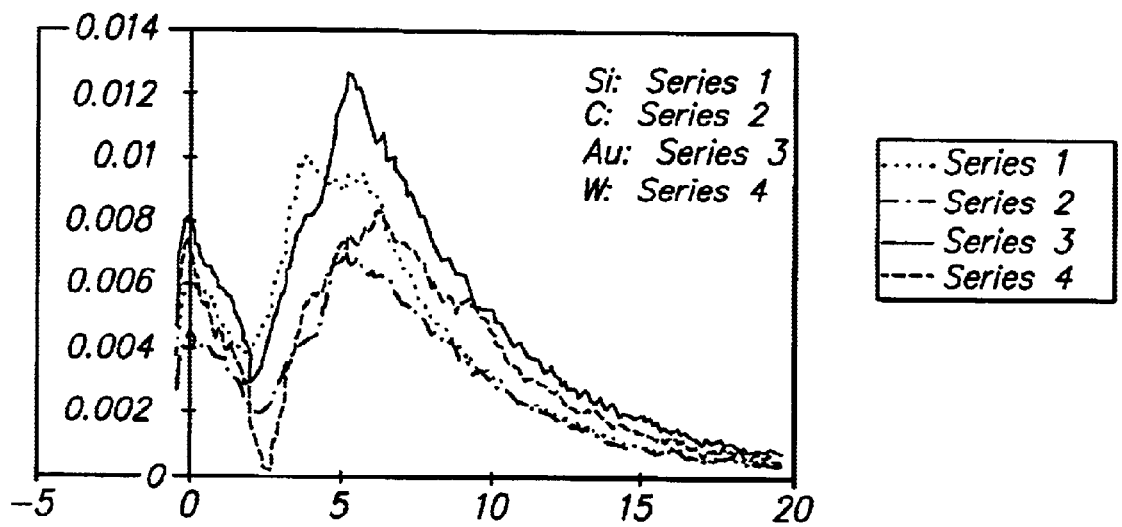
FIG. 7 is another plot of the number of collected electrons (Ne) versus the energy (Ee) obtained from another sample SE spectrum.

Then, descriptors for each material are generated and stored in a library, such as a look-up table. Of course, a general library for these materials can be built in advance and used in its entirety, or by selecting only the appropriate materials expected to be seen at that point of the processing line. Also, it should be appreciated that each of the materials may be scanned many times and the descriptors can be built by using some statistical method (such as average or mean) to correlate the various results into a single set of descriptors. As can be seen from FIG. 6, for both runs of Si the peak is centered at 15 eV, while for W it is at 17 eV. Also, the area under the W curve is larger than that under both Si. Additionally, both curves of Si track each other with sufficient repeatability to obtain meaningful descriptors. Another exemplary SE spectrum obtain is the spot mode is depicted in FIG. 7.

Thus, according to this new "spot mode" approach, a fast determination of material composition of the sample may be obtained, without having to construct a spectrum, such as an auger or x-ray, to accurately identify each element comprising the sample. Notably, in monitoring a production line there's no real need to obtain an accurate account of the elements, since it is known before hand which elements should be present at each step of the process. Thus, by using the inventive spot mode, one can quickly determine whether a particular feature on the sample (such as a particle or a defect), is made out of a foreign material. Such information is important for identifying whether the defect was caused by faulty processing, e.g., inadequate etch clean, or introduced by the processing equipment, e.g., a deteriorating chamber dome or a contaminated gas line.

Secondary Electron Spectroscopy Material Imaging (SESMI):

The second mode of the invention provides fast identification of material composition of features in an image by coding. In the preferred embodiment the coding is color coding, thus rather than providing a gray scale image, the image is color coded according to the SE spectroscopy. In this mode, an image of the relevant area on the sample is obtained. Then SE spectroscopy is performed with respect to each pixel (or groups of pixels—depending on the required resolution). Then, the material composition of each pixel is determined from the SE spectroscopy. Since it is anticipated that only a limited number of materials will be present in the sample, each such material may be assigned a color, with one additional color for "unidentified" category. Then, an image is constructed by using the appropriate color for each pixel according to its material composition.

As can be understood, the material composition for each pixel can be obtained by using the spot mode method described above. A fast method for obtaining SESMI is as follows: N, e.g., ten, images are obtained using N different values of Vwf. The derivative image at each of the N Vwf is calculated as follows:

$$Dim(Vwf)=Im(Vwf-1)-Im(Vwf+1)$$

A new image is then constructed, wherein the value of each pixel is chosen as the Vwf for which the derivative image is maximal at that pixel. Each maxima level is assigned a color, so that a color coded image is obtained. Such a color coded image can assist in rapid identification of foreign matter on the sample.

Figure 8:
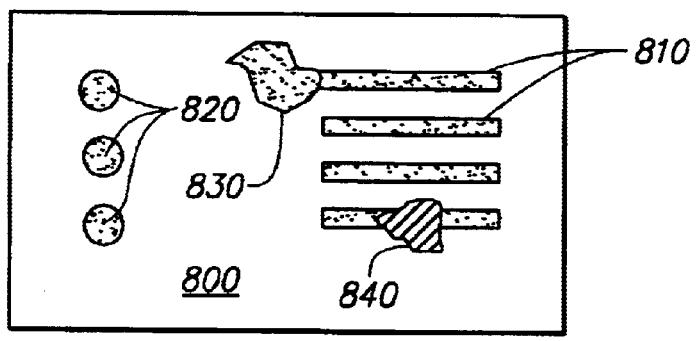
FIG. 8 is a schematic of a pattern coded SESMI.

An example of coded image is depicted in FIG. 8, wherein pattern, rather than color, coding is used. Specifically, the background 800 has no pattern, while lines 810 of a certain material have one pattern while circles 820, made of different material than lines 810, are depicted with another pattern. Two "defects" 830 and 840 are exemplified. Using the pattern coding it is easily evident that defect 830 is made of the same material as lines 810, while defect 840 is made of a foreign material.

A variation of the above would be to construct a library wherein groups of maximas are correlated to various materials that may be present on the sample, e.g., insulators and conductors. The, when the maxima image is obtained, each maxima is compared against the library to determine whether it matches one of the groups in the library. If so, it can be identified as that material and color coded according to the color assigned to that material. Otherwise, it will be coded with an "unidentified" color code.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method for obtaining material composition information in SEM images, comprising:
    a. causing a primary electron beam to impinge upon a sample;
    b. separately collecting secondary electrons emitted from the sample at a plurality of narrow bands so as to obtain an SE spectrum;
    c. calculating a plurality of descriptors corresponding to said SE spectrum; and
    d. correlating the descriptor to a material library to determine the material composition of the sample.

2. The method of claim 1, wherein step c is preceded by the step of:
    b-1. constructing a plot of said SE spectrum.

3. The method of claim 2, wherein the sample material is identified by matching the sample SE spectrum to database stored spectra of all type of possible materials.

4. The method of claim 2, wherein the descriptors are selected at least from: peak location, peak width, integral under the curve, and shape of the curve.

5. A scanning electron microscope, comprising:
    an electron column;
    an electron source providing primary electrons accelerated to Vacc;
    an objective lens;
    at least one secondary electron detector;
    a chuck for holding a sample, said chuck being at potential Vck;
    a ramp generator providing a ramp signal; and,
    a high voltage amplifier receiving said ramp signal and providing corresponding potential to control said Vacc and Vck.

6. A scanning electron microscope, comprising:
    an electron column;
    an electron source providing primary electrons accelerated to Vacc;
    an objective lens;
    a secondary electron deflector;
    at least one electron sensor receiving deflected secondary electrons and providing a plurality of signals corresponding to secondary electrons with various energy levels;
    a processor receiving said plurality of signals and constructing secondary electron spectrum therefrom, calculating a plurality of descriptors corresponding to said secondary electron spectrum, and correlating at least one of said plurality of descriptors to a material library to determine the material composition of the sample.

7. A method for obtaining material information in SEM images, comprising:
    a. causing a primary electron beam to impinge upon a sample;
    b. obtaining a plurality of images, each from secondary electrons collected at pre-defined SE energy;
    c. generating derivative images corresponding to said plurality images; and
    d. constructing a single image having each pixel associated with a value of a descriptor relating to corresponding pixels in the derivative images.

8. The method of claim 7, wherein said descriptor is constructed from one of: peak location, peak width, integral under curve, shape of curve, of a spectrum composed from the derivative images.

9. The method of claim 7, further comprising the step of:
    e. coding said single image according to said SE energy.

10. The method of claim 9, wherein said coding comprises assigning colors to defined SE energy levels.

11. A system for obtaining material composition information in SPM images, comprising:
    an electron column;
    an electron source providing primary electrons accelerated to Vacc;
    a means for biasing secondary electrons to various energy levels, said means comprising a rams generator coupled to a high voltage amplifier to apply a biasing voltage to at least one of:
    the wafer,
    an electron detector face or grid,
    a pole piece of the objective lens,
    an electrode, and
    the accelerating voltage Vacc;
    an objective lens for focusing the primary electrons on a wafer, wherein secondary electrons are emitted from said wafer;
    at least one secondary electron detector for detecting secondary electrons emitted by said wafer, wherein said at least one secondary electron detector provides a plurality of signals corresponding to secondary electrons having various energy levels; and
    a processor receiving said plurality of signals and constructing a secondary electron spectrim, and comparing said secondary electron spectrum with database stored spectra of all type of possible materials .

* * * * *